United States Patent [19]

Budde et al.

[11] Patent Number: 4,920,038
[45] Date of Patent: Apr. 24, 1990

[54] PRINTED CIRCUIT MANUFACTURE EMPLOYING A RADIATION CROSS-LINKABLE PHOTO-POLYMER SYSTEM

[75] Inventors: Klaus Budde, Unterhaching; Oskar Nuyken; Walter Melchior, both of Munich, all of Fed. Rep. of Germany

[73] Assignee: Siemens Aktiengesellschaft, Berlin and Munich

[21] Appl. No.: 267,677

[22] Filed: Nov. 3, 1988

Related U.S. Application Data

[63] Continuation of Ser. No. 858,920, May 2, 1986, abandoned.

[30] Foreign Application Priority Data

Jun. 5, 1985 [DE] Fed. Rep. of Germany ....... 3520277

[51] Int. Cl.$^5$ .................... G03C 5/16; G03C 1/94; G03C 5/00
[52] U.S. Cl. ..................... 430/315; 430/280; 430/287; 430/313; 430/324; 430/275
[58] Field of Search .............. 430/280, 287, 315, 324, 430/313, 275

[56] References Cited

U.S. PATENT DOCUMENTS 3,922,479 11/1975 Older et al. ............... 430/394 X
3,996,121 12/1976 Green et al. .................. 522/100

*Primary Examiner*—Paul R. Michl
*Assistant Examiner*—Cynthia Hamilton
*Attorney, Agent, or Firm*—Hill, Van Santen, Steadman & Simpson

[57] ABSTRACT

In order to achieve a low dielectric constant and in order to improve the constant temperature resistance of radiation-sensitive synthetic resin lacquers, a photo-polymer system which is composed of a furyl acrylic acid esterified epoxy resin with phenoxy or epoxy end groups is employed as coating (2, 13, 4) on a substrate in the manufacture of printed circuits, particularly in multi-layer format. The cross-linking ensues with light in the wavelength range from about 150 through 400 nm preferably in the presence of a sensitizer without any following hot-hardening. As a consequence of its good solubility, the product can be easily processed and requires no intermediate layers when in a multi-layer format. A further area of employment lies in the field of integrated semiconductor circuits in VLSI technology when producing negative photo-resists.

8 Claims, 1 Drawing Sheet

PRINTED CIRCUIT MANUFACTURE EMPLOYING A RADIATION CROSS-LINKABLE PHOTO-POLYMER SYSTEM

This is a continuation, of application Ser. No. 858,920, filed May 2, 1986, now abandoned.

BACKGROUND OF THE INVENTION

1. Field of the Invention

This invention lies in the field of methods for the manufacture of printed circuits, particularly in a multi-layered format, which employ photo-sensitive polymer systems that are cross-linkable by radiation.

2. Prior Art

Methods for the manufacture printed circuits using radiation cross-linkable photo-polymer systems have been proposed in the German Patent applications P 34 24 119.1 corresponding to USSN 749,588 filed June 27, 1985 and P 34 39 606.9 corresponding to USSN 762,513 filed Aug. 5, 1985 now U.S. Pat. No. 4,732,843, respectively. In the method described by German patent application P 34 24 119.1, cinnamic acid-epichlorohydrin-bisphenol A compounds which contain reactive hydroxy or hydroxymethylene groups at the bisphenol building block are employed as initial products for the polymerization in order to shorten the exposure time of radiation-sensitive enamels. The thermal loadability of products of these compounds is in fact extremely high, but such products when homopolymerized display only slight solubilities in standard organic solvents, such solubilities requiring an involved processing. Also, disadvantageous herein is a relatively low storage stability for the unexposed materials.

In the method described in patent application P 34 29606.9, polymer systems on an enamel base are employed both in order to achieve a low dielectric constant and in order to improve the constant temperature stability. In these polymer systems, linear fluoro-polymers having at least two reactive end groups per polymer molecule are employed as initial substances for conversion with radiation-sensitive substances. The conversion of the fluorinated initial substances and the linking thereof to the photo-active substances occurs in several method steps and in an involved way. Particularly due to the typically partly fluorinated solvent being employed, such method step combination also specifically requires involved processing technology in the subsequent multi-layer format.

BRIEF SUMMARY OF THE INVENTION

More particularly, the present invention relates to a method for the manufacture of printed circuits, particularly in multi-layer format, as such are employed in micro-electronics, wherein (a) a photo-sensitive-polymer system which cross-links in response to applied radiation is coated as a layer upon a substrate, particularly a substrate comprising a metal carrier foil; and (b) the desired wiring structure in such layer is produced by light imaging; and thereafter (c) the unexposed portions of the imaged photo-polymer system are dissolved away.

The photo-sensitive-polymer system employed is a furyl acrylic acid-esterified epoxy resin. The exposed substrate metal (resulting from the layer imaging and dissolving) may be reinforced by metallizing, such as by electro-plating or by current-less (electroless) metalization. Also, further layers over a desired wiring structure may be generated in the same fashion by the same steps of coating, structuring, and metalization.

A principal object of the present invention is to provide a method for the manufacture of printed circuits, preferably in multi-layer format, for micro-electronic components, wherein the method utilizes simple steps and results in a product which, due to the employment of the chosen photo-polymer, can forego the addition of a hardening agent. Thus, one can forego a process step of hot-hardening, or, alternatively, of tempering the exposed substrate. The method should also be employable for use in the manufacture of integrated semiconductor circuits in VLSI (i.e., very large scale integration) technology.

This object is achieved by the provision of a method employing as indicated a photo-polymer which is a furyl acrylic acid-esterified epoxy resin with phenoxy end groups or epoxy end groups. Such resin preferably has a molecular weight of less than about 15,000. A cross-linking of such resin is implemented with light radiation preferably having a wavelength in the range from about 150 through 400 nm in the presence of a photo-sensitizer without subsequent hot-hardening. More preferably, the light radiation wavelength ranges from about 300 to 400 nm.

Another object of the present invention is to provide laminate structures containing at least two contiguous layers one layer of which is comprised of an electrically conductive etchable metal, and the second layer of which is comprised of a photo-sensitive polymer that is irradition cross-linkable, such laminate structures having been fabricated by the method provided herein using the photo-polymer taught herein.

Other and further objects, aims, purposes, features, advantages, embodiments, applications, and the like will be apparent to those skilled in the art from the teachings of the present specifications taken with the accompanying drawings.

DETAILED DESCRIPTION

Figure 1:
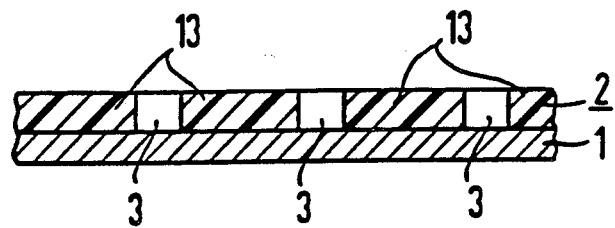
FIGS. 1 and 2 show cross-sectional views of a printed circuit produced by the method step sequences of the present invention.

The photo-polymer systems employed in the present invention when employed as a coated layer upon a metal substrate achieve a low dielectric constant and display a constant temperature resistance as regards radiation sensitive synthetic resin lacquers.

It lies within the scope of the present invention to add sensitizers and photo-initiators, as well as co-sensitizers, to the light-sensitive polymer in total concentrations ranging from about 0.5 through 5 weight percent (based on total photo-polymer composition).

Derivatives of benzophenone, benzoin or acetophenone preferably come into consideration as sensitizers or photoinitiators. Tertiary amines can be employed as co-sensitizers.

The employment of reactive diluants, preferably on an acrylate base and in a concentration range of from about 5 through 30 weight percent based on total photo-polymer composition also lies within the scope of the present invention.

The conversion and cross-linking of a furyl acrylic acid-esterified epoxy resin occurs in the following way:

An exemplary starting epoxy resin (for example, Araldit$_{tm}$ Gt 6099) is characterized by the structure:

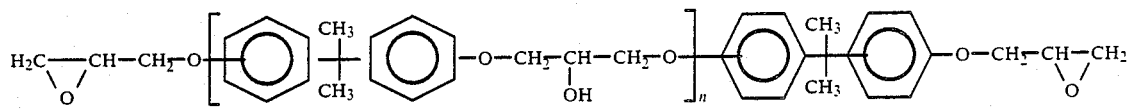

Similarly, an exemplary starting light sensitive group containing esterification agent is a furyl acrylic acid chloride, such as 3-(2-furyl)-acrylic acid chloride. The reaction can be represented as follows:

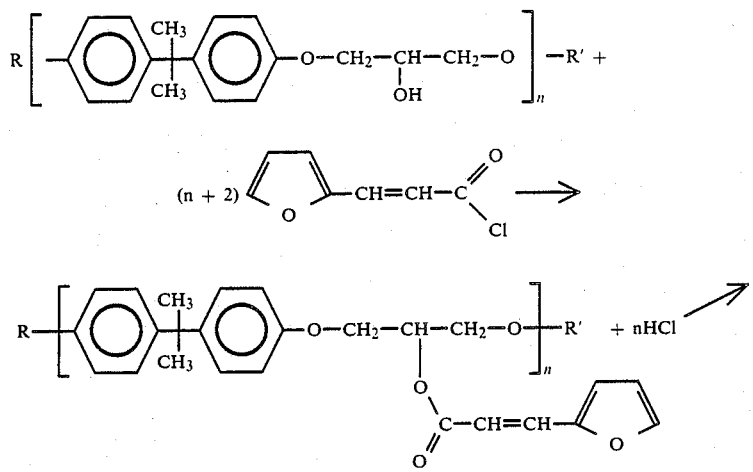

where:

R is

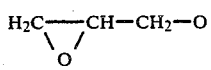

R' is

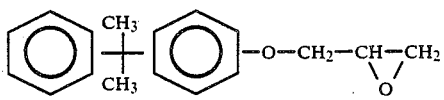

Upon irradiation with UV-light, a cross-linking of the light-sensitive polymer occurs in a known way due to reaction of the acrylic

double bonding.

Phenoxy end groups can also be present instead of the epoxy end groups, as just shown.

A photo-polymerizable epoxy resin is in fact known from German OS No. 26 35 929; however, a hot-hardening format agent is required therein for cross-linking. The multi-layer formatting ensues by means of pressing.

A printed circuit having light-sensitive epoxy resin groups can also be derived from German patent No. 23 42 402; however, the cross-linking therein also occurs upon employment of a hardener acting under heat. Moreover, the multi-layer circuit therein is manufactured by pressing.

German patent No. 24 08 893 contains a radiation-hardenable mask based upon polycarboxylic acid-esterified epoxy compound. Such a hardenable compound is not employed for structure generation, and, thus, for the manufacture of printed circuits. Rather, such is employed as a paint material and for producing printing inks.

Light-sensitive epoxy cinnamates, or, alternatively, phenoxy acrylates suitable for the manufacture of planographic printing plates and copying layer carriers are known from German OS No. 25 03 526. The emphasis therein, however, is placed on the production of high molecular weights in the base polymers (at least about 15,000 to 20,000) and on the omission of sensitizing agents. Reactive diluents are not provided. The utilization made of these products is of a completely different character than that involved in the present invention.

The photo-polymer used in the invention yields a product which exhibits the following properties and advantages over known products:

(1) The dielectric constant $\epsilon_r$ is lower than 3.5; this enables low interconnect spacings;
(2) The glass transition temperature of the cross-linked homopolymer already lies about 170° C.; a high temperature stability derives therefrom;
(3) A high UV sensitivity derives, which is about 5 to 6 times better than is achieved from utilizing the corresponding cinnamic acid compounds;
(4) The addition of reactive diluents allows the setting of predeterminable optimum values for the respective properties identified about under (1) through (3);
(5) The phenoxy resin product contains no hydrolyzable chloride; E-corrosion phenomena (aging and climate test) typical for epoxy resins are thus avoided;
(6) The good solubility in organic solvents enables simple processing; and
(7) Intermediate layers are no longer required given multi-layer structures.

EMBODIMENTS

As is apparent from the foregoing specification, the invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

The application of the photo-polymer system used in the present invention for the manufacture of a multi-layered wiring structure is described below with reference to an exemplary embodiment.

Referring to FIG. 1, there is seen a copper foil which is employed as a carrier, to which a layer 2 of a photo-cross-linkable insulative polymer system as taught in the present invention is applied by immersion or by spray lacquering, for example, to achieve a (dry) layer thickness of from about 5 through 20 μm. Before such application, about 1.5 weight percent (on a total composition weight basis), for example, of a sensitizer, such as, for example, Michler's ketone, is admixed with such polymer system. Such layer 2 is exposed (imaged) and developed with UV radiation in such a manner that the particular plate-throughs to be inserted thereinto, that is, the terminal points of the product chip, arise as plate-through passages 3 positioned in the insulating layer 2. The irradiation is accomplished in a contact or projection method upon employment of a mask (not shown) which covers the region of the passages 3 of the layer 2 (negative resist). The covered parts or passages 3 are subsequently dissolved out with a selected organic solvent (preferably aromatic), such as, for example, toluol; xylol; a ketone, such as methylethyl ketone, an ester, such as 2-ethoxy-ethyl-acetate, a chlorinated hydrocarbon, such as trichloroethylene, or the like. A chemical cross-linking occurs in the exposed parts 13 of the layer 2 which prevents the dissolution of these parts 13 by such solvent action so such parts 13 remain as an insulating layer designated 13 as a whole. After the manufacture of the passages 3 for the platethroughs allocated to this first insulator layer 2 (13), the passages 3 are filled up with a material, such as, for example, copper, having good electrical conductivity, such filling being accomplished in conjunction with the copper foil 1 serving as carrier by means of electro-depositing metalization (identified as plate-throughs 23 in FIG. 2).

Figure 2:
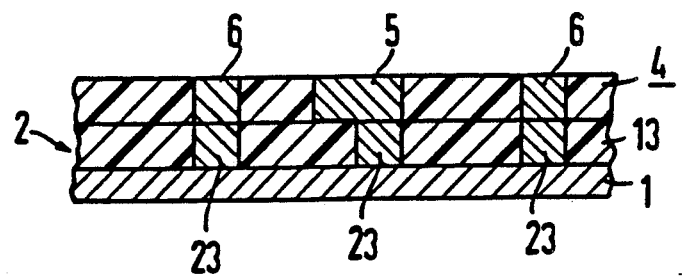

Referring to FIG. 2, it is seen that a further layer 4 of the photo-cross-linkable insulative polymer system of the invention is subsequently applied to the imaged and developed insulating layer 13 containing the plate-throughs 23 in the same fashion as described above in reference to FIG. 1. Interconnect recesses 5 and further plate-through passages 6 are similarly (as described in FIG. 1) inserted into this further layer 4. The exposure and developing of the layer 4 likewise is accomplished in the same manner as described above in reference to FIG. 1. In addition to the plate-through passages 3 of the first insulator layer 2 (13), trough-shaped recesses 5 for further desired interconnects are generated in the second insulator layer 4. These recesses 5 are arranged so that at least one plate-through 23 of the first insulator layer (2, 13) projects into a recess 5 or layer 4. For building up of the interlayer interconnects, the recesses 5 are provided with a metallization by means of electroplating. Further plate-throughs and interconnects can then be applied by means of an appropriate repetition of the manufacturing steps set forth above. The addition of a hardening agent of the polymer system, and, thus, a curing process, can be omitted. The irradiation (imaging) with UV-light in the presence of a photo-sensitizer leads to an adequate cross-linking, or, alternatively, hardening of the polymer.

The wiring format does not require any copper intermediate layers. The high thermal loadability which is required is established. Processing with known resist techniques is not problemmatical. Thus, not only is the method for manufacturing such a structure simplified, but also the reliability of the electrical characteristics of the incorporated circuit is also improved.

For this reason, and also because of the very low Dk and the good solvent dissolution, the polymer system of the invention is excellently well suited for use as a high-temperature-resistant negative resist in the manufacture of integrated semiconductor circuits in VLSI technology wherein the formation of dimensionally true microstructures, or, alternatively, patterns is of great significance.

Although the teachings of our invention have herein been discussed with reference to specific embodiments, it is to be understood that these are by way of illustration only and that others may wish to utilize our invention in different designs or applications.

1. Preparation of furylacrylic acid 1

Close to the instructions of J. Johnson[a] 144 g freshly distilled furfural (1.5 mol), 230 g acetic anhydride (2.25 mol) and 147 g potassium acetate (1.5 mol) are placed into a 2-1 round-bottomed flask fitted with a reflux condenser.

The flask is heated for 4 h at 150° C. with stirring. Subsequently the reaction mixture is cooled to 70° C., diluted with 1,5 l of water and after adding 20 g of activated charcoal boiled for another 10 min. at 90° C.

The solution is filtered while still being hot with suction to avoid early precipitation of furylacrylic acid.

The filtrate is acidified to Congo red by addition of a 1:1-solution of concentrated hydrochloric acid in water (change in colour from red to blue).

After being cooled to 20° C., preferable with stirring, the acid is filtered with suction and washed a few times with ice water. One obtains greenish (traces of indicator), after boiling with activated charcoal white crystals, which are dried at room temperature and high vacuum.

The yield is 109.4 g (53%). The acid 1 melts at 137° C.

2. Preparation of 3-(2-furyl)-acrylic acid chloride 2

By modification of the instructions of T. Sasaki[b] 88 g (0.64 mol) of furylacrylic acid 1 are dissolved in 250 ml of benzene to avoid the exothermic reaction when adding thionyl chloride ($\approx$150 g; 1.25 mol) drop by drop in excess.

The reaction mixture is subsequently heated on a boiling water bath for 2 h (reflux condenser).

Benzene and excessive thionyl chloride are removed by a water jet pump and the residue is distilled at 2–10 torr and 80° C.–105° C.

The brown-yellow distillation product unfortunately becomes rigid in the cooler and sometimes offers trouble by clogging the cooler and has to be brought into the flask with a heat gun. The pungent smelling crystals are soon getting darker at the air and therefore should be stored in the absence of light and air.

The yield is 83.5 g (83.7%). The white, crystalline chloride 2 melts at 33° C.

3. Preparation of the furylacrylic acid esterified epoxy resin 3

10 g unmodified epoxy resin Araldit$_{TM}$ GT6099, $2 \cdot 10^{-3}$ mol) are placed in a 3-1 three-necked flask with a reflux condenser and 50 ml of toluene are added. The resin does not dissolve in toluene. Now 11.67 g ($7 \cdot 10^{-2}$ mol) liquefied chloride 2, corresponding to a double excess, are filled into the flask and stirring is started. During heating the temperature in the flask must remain between 60° C. and 70° C.

Start of reaction is indicated by evaporation of gaseous hydrochloric acid and temperature-rise.

Moreover the epoxy resin dissolves more and more. The reaction is additionally held 3 h at 110° C., and finished when all of the epoxy resin is dissolved.

After the hydrochloric acid has escaped completely the solution reacts neutral to lacmus.

The cooled reaction product is added dropwise to a 3-1 flask filled with isopropanol, where it precipitates as a white or grey agglutinating thread.

The pasty product is purified in an ultrasonic bath with boiling water and afterwards dissolved in 1 l methylethylketone while stirred thoroughly.

Once again it is precipitated in isopropanol, which then is removed by a water jet pump.

After drying at 30° C.-40° C. in high vacuum one obtains a white powder.

The yield is 11.31 g (82.7%).

(a) J. Johnson, Organic Synthesis, Col. Vol 3, E. C. Horning, Ed., Wiley, New York 1962, S. 426

(b) T. Sasaki Biochem. Z. 25, 275 (1910)

Working example

The furylacrylic acid esterified epoxy resin is dissolved in xylene to give a 30% (weight) solution, 2% (weight, referring to the resin) of Michler's Ketone is added. The solution is spin-coated to an electropolished copperfoil. Within one step of coating layer thicknesses between 3 μm and 10 μm can be achieved (4000 rpm to 1500 rpm, respectively). The thickness may be increased to 50 μm by repetitive spin-coating.

Prebake: typical 2 h 60° C.

Exposure: for 4 μm layer 10 sec., 25 mW/cm$^2$, 365 nm probe, soft contact.

Development: spraying or dipping with toluene, max. 60 sec stopped by propanol-2

Postbake: 30 min., 140° C.

Resolution: better than 10 μm

Working Example

Physical properties of cured furylacrylic acid esterified epoxy resin:

Glass transition temperature Tg: 112° C.

Dielectric constant $\epsilon_r$ (25° C., 100 kHz): 3.09 dielectric loss factor tan δ (25° C., 100 kHz) < 0.01

Mixtures:

(i) with 1.5% (weight) pentaerithritoltriacrylate Tg: 124° C.

(ii) with 2% (weight) pentaerithritoltetraacrylate Tg: 164° C.

$\epsilon_r$ and tan δ don't change within the limits of experimental error.

We claim:

1. A method for the manufacture of a printed circuit comprising the steps of successively
   (a) coating a metal foil with a layer comprised of a photo-sensitive furyl acrylic acid esterified epoxy resin having a molecular weight below approximately 15,000, the resin being produced by reacting a bisphenol A-epichlorohydrin-phenoxy resin with 3-(2-furyl)-acrylic acid chloride the layer including a photo-initiator;
   (b) exposing said layer to imaging irradiation, thereby to produce a latent image of a desired wiring structure, the exposing being accomplished by light radiation having a wavelength of approximately 150 to about 400 nm without subsequent hot-hardening;
   (c) washing the resulting so irradiated layer with a solvent to dissolve away unexposed portions thereof, thereby to produce a developed image of such desired wiring structure in the resulting so washed layer through which areas of said metal foil are exposed;
   (d) metallizing the resulting so washed, irradiated layer to deposit metal in said layer portions wherein said metal foil areas were so exposed; and
   (e) producing further successive layers upon said resulting so exposed and so washed layer of said furyl acrylic acid esterified epoxy resin, each such successive layer being produced by the successive repetition of said steps (a), (b), (c), and (d) without the need for grinding the further successive layers.

2. The method of claim 1 wherein said metallizing is accomplished by electroplating.

3. The method of claim 1 wherein said metallizing is accomplished by currentless metalization.

4. The method of claim 1 wherein said imaging radiation has a wavelength in the range from about 300 through 400 nm.

5. The method of claim 1 wherein at least one material selected from the group consisting of photo-sensitizers, photoinitiators, co-sensitizers is admixed with said furyl acrylic acid esterified epoxy resin and in an amount sufficient to produce a product composition containing from about 0.5 through 5% of said material.

6. The method of claim 5 wherein said photo-initiator material comprises at least one derivative of benzophenone, benzoin and acetophenone and said co-sensitizer material comprises at least one tertiary amine.

7. The method of claim 6 wherein Michler's ketone (4.4 -bis (dimethyl amino) -benzophenone) is employed as a sensitizer.

8. The method of claim 1 wherein at least one reactive diluent is admixed with said furyl acrylic acid esterified epoxy resin in an amount sufficient to produce a product composition containing from about 5 through 30 weight % of said diluent.

* * * * *